(12) United States Patent
Zhang et al.

(10) Patent No.: US 9,832,916 B2
(45) Date of Patent: Nov. 28, 2017

(54) EMI SHIELDING DEVICE FOR AN OPTICAL TRANSCEIVER

(71) Applicant: SOURCE PHOTONICS (CHENGDU) CO., LTD., Chengdu (CN)

(72) Inventors: Shaoyou Zhang, Chengdu (CN); Shengzhong Zhang, West Hills, CA (US)

(73) Assignee: Source Photonics (Chengdu) Co., Ltd., Chengdu (CN)

( * ) Notice: Subject to any disclaimer, the term of this patent is extended or adjusted under 35 U.S.C. 154(b) by 166 days.

(21) Appl. No.: 14/761,242

(22) PCT Filed: Jun. 16, 2015

(86) PCT No.: PCT/CN2015/081542
§ 371 (c)(1),
(2) Date: Jul. 15, 2015

(87) PCT Pub. No.: WO2016/201618
PCT Pub. Date: Dec. 22, 2016

(65) Prior Publication Data
US 2017/0142870 A1    May 18, 2017

(51) Int. Cl.
*H04B 10/00* (2013.01)
*H05K 9/00* (2006.01)
*H04B 10/40* (2013.01)

(52) U.S. Cl.
CPC ........... *H05K 9/0058* (2013.01); *H04B 10/40* (2013.01); *H05K 9/0015* (2013.01)

(58) Field of Classification Search
CPC ..... H05K 9/0058; H05K 9/0015; H04B 10/40

(Continued)

(56) References Cited

U.S. PATENT DOCUMENTS 6,348,654 B1 * 2/2002 Zhang ................ H05K 9/0015
174/362
6,749,448 B2 * 6/2004 Bright ................ G02B 6/4201
439/152

(Continued)

FOREIGN PATENT DOCUMENTS

CN    103869426 A    6/2014
CN    104597574 A    5/2015

OTHER PUBLICATIONS

Jun Xu et al.; "Light Receiving and Transmitting Module"; Bibliographic Data of CN104597574 (A); May 6, 2015; http://worldwide.espacenet.com.

(Continued)

*Primary Examiner* — Juan A Torres
(74) *Attorney, Agent, or Firm* — Andrew D. Fortney; Central California IP Group, P.C.

(57) ABSTRACT

An EMI shielding device for an optical transceiver is disclosed. The EMI shielding device includes a shell with an optical and electrical interfaces al opposed ends. The shell includes a base and an upper cover. The upper cover includes a plate having at least two flanks, each having a lateral plate that extends downward. The base includes a base plate having at least two flanks, each having a base side baffle. The upper covet plate is located between the base side baffles. The lower ends or surfaces of the upper cover lateral plates have serrations thereon. A conductive gasket under the serrations contacts the base. The conductive gasket and the serrations result in reliable multipoint contact between the upper cover lateral plates and the base, thereby providing reliable electrical continuity between the upper cover and the base, and reducing electromagnetic leakage.

19 Claims, 3 Drawing Sheets

(58) Field of Classification Search
USPC .......................................................... 398/117
See application file for complete search history.

(56) References Cited

U.S. PATENT DOCUMENTS

| | | | | |
|---|---|---|---|---|
| 6,755,578 B1* | 6/2004 | Mynatt | ................ | G02B 6/4201 |
| | | | | 385/147 |
| 8,319,118 B2 | 11/2012 | Edwards et al. | | |
| 8,488,334 B2 | 7/2013 | McColloch | | |
| 8,976,539 B2 | 3/2015 | Edwards et al. | | |
| 2002/0131730 A1* | 9/2002 | Keeble | ................ | G02B 6/4201 |
| | | | | 385/92 |
| 2003/0171016 A1* | 9/2003 | Bright | ................ | G02B 6/4201 |
| | | | | 439/160 |
| 2006/0096773 A1* | 5/2006 | Cochrance | ........... | H05K 9/0015 |
| | | | | 174/377 |
| 2006/0133739 A1* | 6/2006 | Kim | ....................... | G02B 6/421 |
| | | | | 385/88 |
| 2008/0095541 A1* | 4/2008 | Dallesasse | ............. | H04B 10/40 |
| | | | | 398/191 |
| 2009/0028557 A1* | 1/2009 | Togami | ................ | H05K 9/0058 |
| | | | | 398/39 |
| 2009/0211801 A1 | 8/2009 | Edwards et al. | | |
| 2012/0155054 A1 | 6/2012 | McColloch | | |
| 2015/0030339 A1* | 1/2015 | Margalit | .............. | H04B 10/506 |
| | | | | 398/183 |
| 2016/0192545 A1* | 6/2016 | Mao | ..................... | H05K 9/0058 |
| | | | | 398/136 |

OTHER PUBLICATIONS

Kiaofeng Zhang et al.; "Pluggable Optical Transceiver Module"; Bibliographic Data of CN103869426 (A); Jun. 18, 2014; http://worldwide.espacenet.com.

International Search Report and Written Opinion; International Searching Authority/CN dated Mar. 4, 2016; International Application No. PCT/CN2015/081542; 8 pages; International Searching Authority/State Intellectual Property Office of the P.R. China, Beijing, China.

* cited by examiner

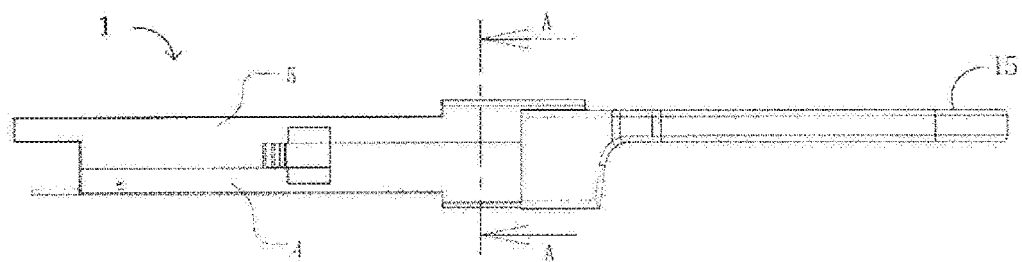
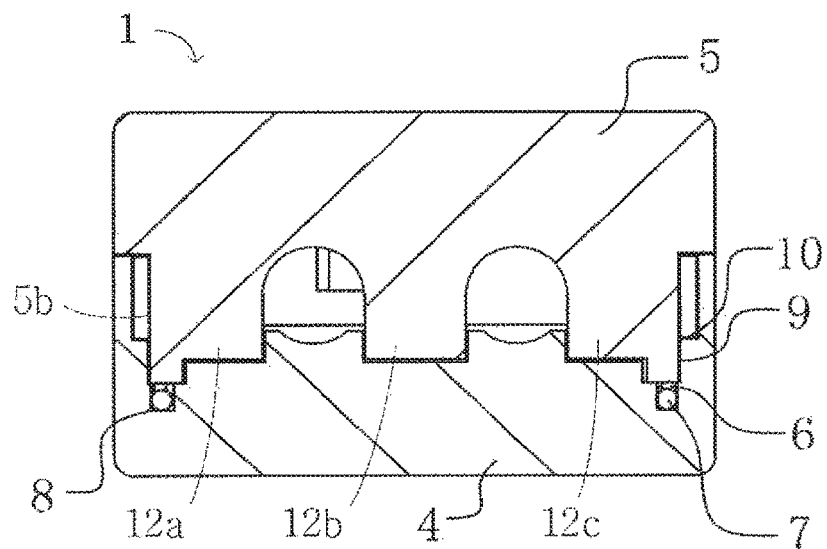
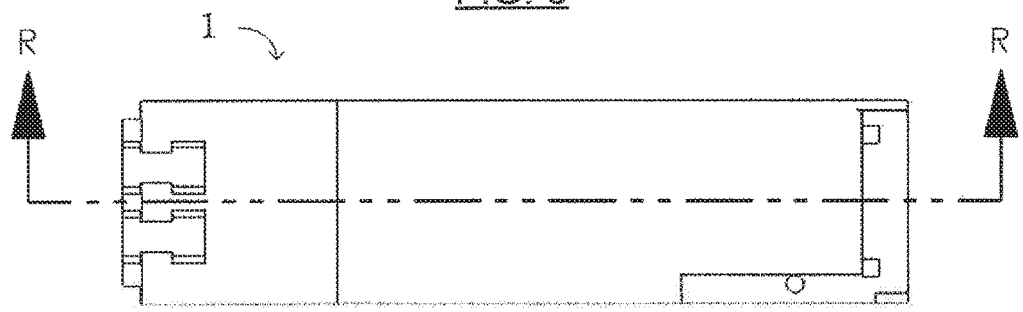

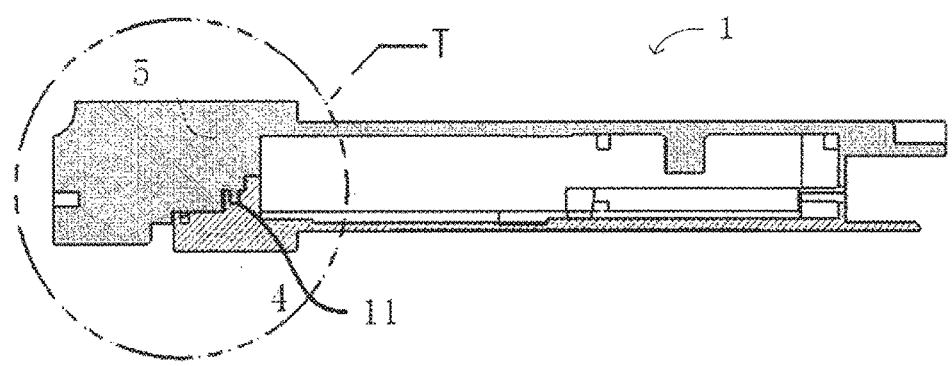
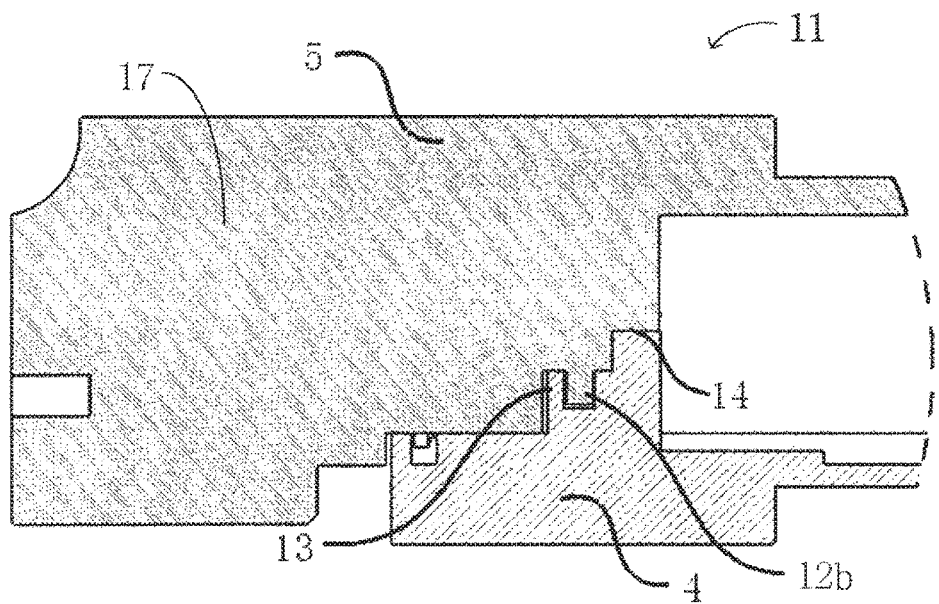

EMI SHIELDING DEVICE FOR AN OPTICAL TRANSCEIVER

FIELD OF THE INVENTION

The present invention relates to the field of optical modules, especially to an optical module and/or optical transceiver with an EMI shielding device.

DISCUSSION OF THE BACKGROUND

Optical transceivers, or optical modules for short, are utilized to convert electrical signals into optical signals and to convert optical signals into electrical signals. Typically, an optical module includes optical subassemblies, functional circuits and optical interfaces, and are a significant component of an optical fiber communication system. Optical modules can be defined as SFP-compliant, GBIC-compliant, XFP-compliant, etc., according to their package type. SFP optical modules are hot-pluggable small form factor modules, so the volume of a SFP optical module is about half of that of a GBIC module, which can effectively double the number of ports on a panel of an optical switch or hub and provide functions consistent with GBIC optical modules.

With regard to conventional optical modules, most low speed optical modules are assembled using upper and lower shells that match up with each other, without any particular electromagnetic interference (EMI) reduction or prevention process. This substantially meets the operating requirements of low speed optical modules, but still has deficiencies in EMI protection. When such shell structures are applied to high speed optical modules, electromagnetic waves may escape from the joint or interface between the upper and lower shells. This may create electromagnetic interference or serious electromagnetic leakage.

This "Discussion of the Background" section is provided for background information only. The statements in this "Discussion of the Background" are not an admission that the subject matter disclosed in this "Discussion of the Background" section constitutes prior art to the present disclosure, and not part of this "Discussion of the Background" section may be used as an admission that any part of this application, including this "Discussion of the Background" section, constitutes prior art to the present disclosure.

SUMMARY OF THE INVENTION

The present invention is intended to overcome one or ore deficiencies in the prior art, and provide an EMI shielding device for optical transceiver that can effectively reduce electromagnetic leakage and provide better EMI performance for optical modules.

In order to achieve the present objective(s), in one respect, the present invention concerns an EMI shielding device that includes a shell with an optical interface at a first end and an electrical interface at a second end. The shell includes a base and an upper cover. The shell may have a first inner side, adjacent to the optical interface, configured to receive an optical subassembly (OSA), and a second inner side, adjacent to the electrical interface, configured to receive a printed circuit board (PCB). The upper cover comprises an upper cover roof or plate having at least two flanks, each flank having an upper cover lateral plate that extends downward and that includes a lower end or surface. The base comprises a base plate having at least two flanks, each flank having a base side baffle. The upper cover plate or roof is between the base side baffles. The lowermost end or surface of each upper cover lateral plates and/or the lowermost surface of the upper cover plate or roof adjacent to the optical interface have serrations thereon. A conductive gasket (e.g., a conductive polymer or rubber strip) is under the serrations, and is in contact with the base.

In one or more embodiments, the serrations are uniform and continuous on the lower end faces of the two upper cover lateral plates and the lower surface of the first side of the upper cover plate or roof adjacent to the optical interface. The serrations may also comprise or be made of a conductive material.

In one or more embodiments, each of the serrations has a U-shape. This structure brings better shielding performance, has a large contact area, and delivers a low and/or more distributed pressure onto the conductive gasket, thereby protecting the conductive gasket from being damaged.

In one or more embodiments, the base or base plate has a locating groove to accommodate the conductive gasket. This structure is convenient for fixing the conductive gasket, and can prevent circuit components from shorting due to the movement of the conductive gasket. In one example, the locating groove on the base or base plate is under the serrations.

In various embodiments, the base comprises at least two vertical fitting surfaces between the base side baffles, configured to receive the upper cover lateral plates, and the base further comprises a horizontal joint face at or near the optical interface.

The EMI shielding device may further comprise an engagement structure at or near the optical interface. In this engagement structure, the upper cover lateral plates may be connected with the base side baffles using Z-shape labyrinth packing (rather than flat fitting), which can effectively attenuate EMI leakage. In one or more embodiments, the engagement structure comprises one or more tongues or tabs on one of the upper cover and base, and one or more grooves or slots on the other of the upper cover and base. The tongue(s) or tab(s) are insertable into the groove(s) or slot(s). For example, each of the tongue(s) or tab(s) is configured to fit securely into a unique one of the groove(s) or slot(s).

In one or more embodiments, the upper cover and the base are connected by placing the conductive gasket in the locating groove in the base, and pressing the upper cover and the base together. The conductive gasket can fill or block the spaces between adjacent serrations during or after pressing.

Relative to prior approaches, the present invention provides the following advantages: by adding a conductive gasket to the fitting surfaces between the upper cover and the base and creating a serration structure on the lower end face of the upper cover lateral plate, reliable multipoint contact can be made between the upper cover lateral plates, thereby providing reliable electrical continuity between the upper cover and the base (which may be facilitating when the gaskets have good elasticity and conductivity). Also, electromagnetic leakage can be effectively reduced with a shielding cavity formed by the serrations, the conductive gaskets, and the base.

BRIEF DESCRIPTION OF THE DRAWINGS

FIG. 3 is a side view of the assembled exemplary shell of FIG. 1.

FIG. 4 is a cross-sectional view of the assembled exemplary shell of FIG. 1, along the line A-A in FIG. 3.

FIG. 5 is a top view of the exemplary shell of FIG. 1 in accordance with one or more embodiments of the present invention.

FIG. 6 is a cross-sectional view of the exemplary shell of FIG. 1, along the line R-R in FIG. 5.

FIG. 7 is an enlarged drawing of the encircled portion T in FIG. 6 of the exemplary shell of FIG. 1.

Figure 1:
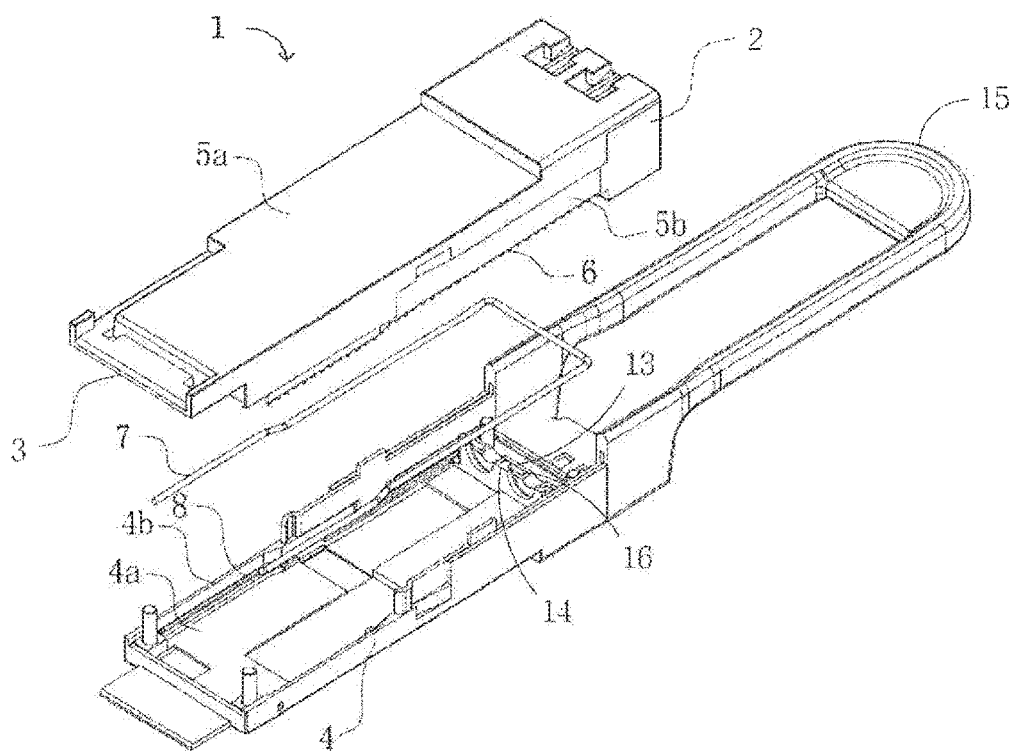
FIG. 1 is a diagram showing a three-dimensional exploded view of an exemplary shell for an optical transceiver in accordance with one or more embodiments of the present invention.

The structures and/or features shown in the drawings are identified by the following identifiers: shell—1, optical interface—2, electrical interface—3, base—4, base plate—4a, base side baffle—4b, upper cover—5, upper cover plate or roof—5a, upper cover lateral plate—5b, serration—6, conductive gasket—7, locating groove—8, vertical fitting surface—9, horizontal joint face—10, engagement structure—11, tongue or tab—12, slot side wall—13, horizontal extending structure—14, handle—15, grooves or slots—16 and center dividing wall—17.

DETAILED DESCRIPTION

Reference will now be made in detail to various embodiments of the invention, examples of which are illustrated in the accompanying drawings. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the disclosure.

Some portions of the detailed descriptions which follow are presented in terms of processes, procedures, logic, functions, and other symbolic representations of operations on signals, code, data bits, or data streams within a computer, transceiver, processor, controller and/or memory. These descriptions and representations are generally used by those skilled in the data processing arts to effectively convey the substance of their work to others skilled in the art. A process, procedure, logic operation, function, process, etc., is herein, and is generally, considered to be a step or a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and/or otherwise manipulated in a computer, data processing system, optical component, or circuit. It has proven convenient at times, principally for reasons of common usage, to refer to these signals as bits, streams, values, elements, symbols, characters, terms, numbers, information or the like. It should be borne in mind, however, that all of these and similar terms are associated with the appropriate physical quantities and/or signals, and are merely convenient labels applied to these quantities and/or signals.

Unless specifically stated otherwise, or as will be apparent from the following discussions, it is appreciated that throughout the present application, discussions utilizing terms such as "processing," "operating," "calculating," "determining," or the like, refer to the action and processes of a computer, data processing system, or similar processing device (e.g., an electrical, optical, or quantum computing or processing device or circuit) that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display device, etc.) into other data or information similarly represented as physical quantities within other components of the same or a different system or architecture.

Furthermore, in the context of this application, the terms "signal" and "optical signal" refer to any known structure, construction, arrangement, technique, method and/or process for physically transferring a signal or optical signal, respectively, from one point to another. Also, unless indicated otherwise from the context of its use herein, the terms "fixed," "given" "certain" and "predetermined" generally refer to a value, quantity, parameter, constraint, condition, state, process, procedure, method, practice, or combination thereof that is, in theory, variable, but is typically set in advance and not varied thereafter when in use. Similarly, for convenience and simplicity, the terms "time," "rate," "period" and "frequency" are, in general, interchangeable and may be used interchangeably herein, as are the terms "data," "bits," and "information," but these terms are generally given their art recognized meanings.

For the sake of convenience and simplicity, the terms "optical" and "optoelectronic" are generally used interchangeably herein, and use of either of these terms also includes the other, unless the context clearly indicates otherwise, bat these terms are generally given their art-recognized meanings herein. Furthermore, the term "transceiver" refers to a device having at least one receiver and at least one transmitter, and use of the term "transceiver" also includes the individual terms "receiver" and/or "transmitter," unless the context clearly indicates otherwise. Also, for convenience and simplicity, the terms "connected to," "coupled with," "communicating with" "coupled to," and grammatical, variations thereof (which terms also refer to direct and/or indirect relationships between the connected, coupled and/or communicating elements unless the context of the term's use unambiguously indicates otherwise) may be used interchangeably, but these terms are also generally given their art-recognized meanings.

Various embodiments and/or examples disclosed herein may be combined with other embodiments and/or examples, as long as such a combination is not explicitly disclosed herein as being unfavorable, undesirable or disadvantageous. The invention, in its various aspects, will be explained in greater detail below with regard to exemplary embodiments.

An Exemplar Shell for an Optical Transceiver

The present invention concerns a shell or housing with an EMI shielding device, for an optical module and/or optical transceiver. FIGS. 1-6 show an exemplary shell or housing 1, which includes serrations (e.g., one or more rows of serrations) 6, a conductive gasket 7, one or more locating grooves 8, one or more vertical fitting surfaces 9, a horizontal joint face 10, an engagement structure 11, a raised seam, tongue or tab 12, a groove or slot 16 with a side wall 13, a horizontal extending structure 14, and a handle 15.

As shown in FIGS. 1-7, the EMI shielding device for an optical module in accordance with embodiments of the present invention includes a shell 1 with an optical interface 2 at one end and an electrical interface 3 at another end, a first side inside the shell 1 adjacent to the optical interface 2 configured to receive an OSA, and a second side inside the shell 1 adjacent to the electrical interface 3 configured to receive a PCB. The shell 1 includes a base 4 and an upper cover 5. The base 4 and upper cover 5 may each comprise one or more plastic materials, and each can be formed by injection molding, for example. The upper cover 5 comprises an upper cover plate or roof 5a and opposing flanks or sides, each of which includes a lateral plate 5b that extends downwards from the upper cover plate or roof 5a. The base 4 comprises a base plate 4a opposing flanks or sides, each of which includes a baffle 4b. The upper cover plate or roof 5a is located between the base side baffles 4b. That is, when the shed 1 is sealed, die base plate 4a covers the outermost portions or surfaces of the upper cover lateral plates 5b.

Figure 2:
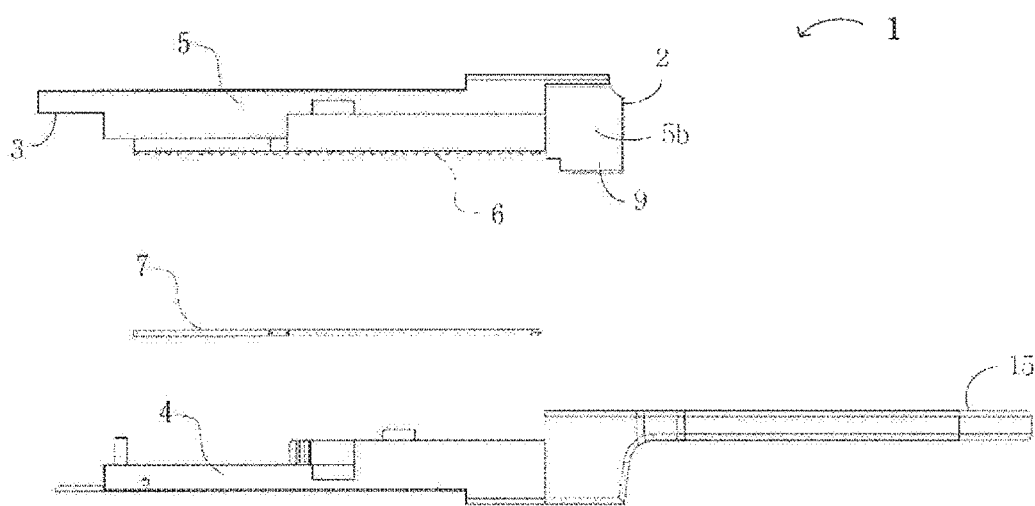
FIG. 2 is an exploded side view of the exemplary shell of FIG. 1 in accordance with one or more embodiments of the present invention.

The lower ends or surfaces of the tipper cover lateral plates 5b and the lowermost surfaces of the upper cover 5 adjacent to the electrical interface 3 have serrations 6 thereon (FIGS. 1-2 and 4). The serrations 6 on the lower ends or surfaces of the two upper cover lateral plates 5b and the lowermost surface of the upper cover 5 adjacent to the electrical interface 3 are generally uniform and continuous. The serrations 6 may also comprise or consist of a conductive material (e.g., a metal, such as aluminum, zinc alloy, nickel, steel [e.g., stainless steel], or a combination thereof [e.g., nickel-plated zinc alloy]). More specifically, in the embodiment shown, the serrations 6 have a trapezoidal, triangular, or convex structure (e.g., U-shape or V-shape). For example, the ends of the serrations 6 furthest from the lower ends or surfaces of the upper cover lateral plated 5b and the lowermost surfaces of the upper cover 5 adjacent to the electrical interface 3 may have a shape, are or curve that is the same in each serration. In other embodiments, the ends of the serration 6 may be cone-shaped. Relative to conventional serrations similar to standard-pyrometric-cone vehicle gear, the ends of the present serrations 6 create lower pressure on the conductive gasket 7, or distribute pressure over a greater area of the conductive gasket 7, helping to protect the conductive gasket 7.

A conductive gasket 7 (which may comprise a conductive polymer or rubber strip, and which may have a circular, oval, square, rectangular of other cross-sectional shape) is deployed under the serrations 6 (FIGS. 1 and 4), and is in contact with the base plate 4a (FIG. 4). The base plate 4a has a locating groove 8 to accommodate the conductive gasket 7. This structure is convenient for fixing the conductive gasket 7 and can prevent circuit components from shorting out due to movement of the conductive gasket 7. Thus, in various embodiments, the locating groove 8 may be located inside or formed in the vertical sidewalls 4b of the base 4. In some such embodiments, the locating groove 8 may be between the vertical sidewall 4b and an inner wall or ridge, and the locating groove 8 may have a width of from 1.0 to 1.5 times the width of the conductive gasket 7 and a depth of from 1 to 5 times the height of the conductive gasket 7. Furthermore, the conductive gasket 7 may have a width of from 0.1-2.0 mm, a height of from 0.1-2.0 mm, and a cross-sectional shape that is circular, oval, square, or rectangular, for example. In addition, the locating groove 8 may have a width of from 0.2-3.0 mm, and a height of from 0.2-5.0 mm. The locating groove 8 may also extend laterally across the end of the base 4 at the optical interface 2, at a position closer to the handle 15 than the engagement structure 11.

Adding a conductive gasket 7 to the fitting surfaces between the upper cover 5 and the base 4, and creating serrations 6 having a predetermined structure on the lowermost end or surface of each upper cover lateral plate 5b, can result in reliable multipoint contact by the upper cover lateral plates 5b (e.g., with the conductive gasket 7), thereby providing reliable electrical continuity between the upper cover 5 and the base 4. Thus, the conductive gasket 7 should have good elasticity and conductivity. Also, electromagnetic leakage can be effectively reduced with a shielding cavity formed by the serration 6, the conductive gasket 7, and the base 4.

At least two vertical fitting surfaces 9 (FIGS. 2 and 4) are between the upper cover lateral plates 5b and the base side baffles 4b, and a horizontal joint face 10 (FIG. 4) is on the base 4, between the vertical fitting surfaces 9. In this structure, the upper cover lateral plates 5b are connected with the base side baffles 4b using a Z-shape labyrinth packing (e.g., one or more tongue-and-groove type or tab-in-slot type fittings), rather than a flat fitting (a conventional approach). Labyrinth packing can effectively attenuate EMI leakage. Exemplary tongues or tabs 12a-c are shown in FIGS. 4 and 7, and exemplary grooves or slots 16 are shown in FIG. 1.

As shown in FIGS. 6 and 7, a labyrinth engagement structure 11 is provided between the base 4 and the upper cover 5, inside the shell 1 and at the end of the shell 1 at the optical interface 2.

In the embodiment shown in FIGS. 1, 6 and 7, a labyrinth engagement structure 11 is formed by tongue or tabs 12a-c on the upper cover 5 and corresponding slots or grooves 16 (defined in part by slot side wall 13) on the base 4. The tongues or tabs 12a-c on the upper cover 5 have one or more dimensions configured to match a corresponding dimension (e.g., width, length, thickness, height, depth, etc.) of the slots or grooves 16 on the base 4, to enable the tongues or tabs 12a-c to fit securely in the slots or grooves 16. As shown in the labyrinth engagement structure 11 in FIG. 7, the height and thickness of the sidewall 13 matches the height of the corresponding tongue or tab 12b and the spacing between the tongue or tab 12b and a center dividing wall 17 at the optical interface 2 of the upper cover 5. Similarly, the height of the tongue or tab 12b matches the depth of the corresponding slot or groove 16. The slots or grooves may also have a shape that complements the shape(s) of the corresponding tongues or tabs. The labyrinth engagement structure 11 also has a horizontal extending structure 14, which may support the upper cover 5 and separate optical fibers (e.g., a receiver optical fiber and a transmitter optical fiber; not shown) that are inserted into the optical interface 2. With this structure, the transmission distance of any electromagnetic field that would otherwise pass through the structure 11 is attenuated.

An Exemplary Transceiver

The present invention further relates to an optical device, optical module and/or optical communication device including the present shell or housing and EMI shielding device. For example, the optical device, optical module and/or optical communication device may be an optical transceiver, which may comprise a receiver optical subassembly and a transmitter optical subassembly inside the shell 1 near the optical interface 2. The receiver optical subassembly generally includes a photodiode or other optical signal detector. The transmitter optical subassembly generally includes a laser diode or other optical signal transmitter. The photodiode is positioned to receive an incoming optical signal from the receiver optical fiber. The laser diode is positioned to emit an outgoing optical signal to the transmitter optical fiber.

In further embodiments, the transmitter optical subassembly may further include an optical signal detector (e.g., a monitoring photodiode), and the receiver optical subassembly may further include a transimpedance amplifier (TIA). The monitoring photodiode is configured to receive a part of the outgoing optical signal from the laser diode, and may be used to determine a characteristic or property of the outgoing optical signal (e.g., a signal strength or output power of the laser diode) and provide a feedback signal relating to the characteristic or property, to enable the optical transceiver to adjust the same. The TIA is electrically connected to the receiver photodiode, and may be on a PCB, closer to the electrical interface 3 than the receiver photodiode. Thus, the TIA is configured to receive an electrical signal from the photodiode and transmit an amplified electrical signal along a trace on the PCB to the electrical interface. Each of the monitoring photodiode and the receiver photodiode may be an avalanche photodiode.

CONCLUSION/SUMMARY

Embodiments of the present invention advantageously provide an EMI shielding device for an optical transceiver. The EMI shielding device includes a shell with a base and an upper cover, and an optical and electrical interfaces at opposed ends. Each of the upper cover and the base includes a plate having at least two flanks (e.g., opposed sides). Each flank on the upper cover plate has a lateral plate that extends downward, and the lower ends or surfaces of the upper cover lateral plates have serrations thereon. Each flank on the base plate has a side baffle. The upper cover plate is between the base side baffles. A conductive gasket (e.g., a conductive polymer or rubber strip) under the serrations contacts the base. The serrations may be conductive, uniform and continuous, and/or arranged in a row along the lower end or surface of the upper cover lateral plates. The serrations may also have a curved (e.g., convex) or U-shape. As a result, the conductive gasket and the serrations can provide reliable multipoint contact between the upper cover lateral plates and the base, thereby reducing electromagnetic leakage.

The foregoing descriptions of specific embodiments of the present invention have been presented for purposes of illustrations and description. They are not intended to be exhaustive or to limit the invention to the precise forms disclosed, and obviously many modifications and variations are possible in light of the above teachings. The embodiments were chosen and described in order to best explain the principle of the invention and its practical applications, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An EMI shielding device for an optical transceiver, comprising:
    a shell with an optical interface at a first end and an electrical interface at a second end,
    wherein said shell includes a base and an upper cover, said upper cover comprises an upper cover plate and at least two flanks, each flank having an upper cover lateral plate that extends downward and that includes a lower end or surface,
    said base comprising a base plate having at least two flanks, each flank having a base side baffle,
    an engagement structure comprising one or more tongues or tabs on one of the upper cover and the base, and one or more grooves or slots on the other of the upper cover and the base, the one or more tongues or tabs being insertable into the one or more grooves or slots;
    at least said upper cover plate being between the base side baffles,
    each lower end or surface of said upper cover lateral plates adjacent to the optical interface has serrations thereon, wherein the serrations comprise a conductive material and are absent in regions of the upper cover lateral plates in or near the electrical interface, and
    said EMI shielding device further comprises a conductive gasket under the serrations and in contact with the base, wherein the base comprises a locating groove that accommodates the conductive gasket, has a width of up to 1.5 times a width of the conductive gasket, and a depth of up to 5 times a height of the conductive gasket.

2. The EMI shielding device of claim 1, wherein said serrations are uniform and continuous on the lower end or surface of the upper cover lateral plates.

3. The EMI shielding device of claim 1, wherein the locating groove is under the serrations.

4. The EMI shielding device of claim 1, wherein each of the one or more tongues or tabs is configured to fit securely into a unique one of the one or more grooves or slots.

5. The EMI shielding device of claim 1, wherein the base comprises at least two vertical fitting surfaces between the base side baffles, configured to receive the upper cover lateral plates.

6. The EMI shielding device of claim 1, wherein the shell includes a first inner side adjacent to the optical interface, configured to receive an optical subassembly (OSA).

7. The EMI shielding device of claim 1, wherein the locating groove is located inside or formed in the side baffles of the base.

8. An optical transceiver, comprising:
    the EMI shielding device of claim 1;
    an optical receiver comprising a photodiode, configured to receive an incoming optical signal from a first fiber at the optical interface; and
    an optical transmitter comprising a laser diode, configured to emit an outgoing optical signal to a second fiber at the optical interface.

9. EMI shielding device of claim 1, wherein the width of the locating groove is at least 1.0 times the width of the conductive gasket, and the height of the locating groove is at least 1.0 times the height of the conductive gasket.

10. EMI shielding device of claim 1, wherein the width of the conductive gasket is from 0.1-2.0 mm, and the height of the conductive gasket is from 0.1-2.0 mm.

11. The EMI shielding device of claim 2, comprising a plurality of said serrations in a row on the lower end or surface of the upper cover lateral plates.

12. The EMI shielding device of claim 2, wherein each of said serrations has a U-shape.

13. The EMI shielding device of claim 5, wherein the base further comprises a horizontal joint face at or near the optical interface.

14. The EMI shielding device of claim 6, wherein the shell includes a second inner side adjacent to the electrical interface, configured to receive a printed circuit board (PCB).

15. The EMI shielding device of claim 7, wherein the locating groove is between the side baffle and an inner wall or ridge.

16. The EMI shielding device of claim 7, wherein the locating groove extends laterally across an end of the base at the optical interface.

17. The optical transceiver of claim 8, wherein the optical receiver further comprises a transimpedance amplifier, configured to receive an electrical signal from the photodiode and transmit an amplified electrical signal along a first trace to the electrical interface.

18. The optical transceiver of claim 8, wherein the optical transmitter further comprises a monitoring photodiode, configured to receive part of the outgoing optical signal from the laser diode, and provide a feedback signal relating to a characteristic or property of the outgoing optical signal.

19. EMI shielding device of claim 10, wherein the width of the locating groove is from 0.2-3.0 mm, and the height of the locating groove is of from 0.2-5.0 mm.

* * * * *